United States Patent

Casper et al.

[11] Patent Number: 5,963,608
[45] Date of Patent: Oct. 5, 1999

[54] CLOCK EXTRACTOR FOR HIGH SPEED, VARIABLE DATA RATE COMMUNICATION SYSTEM

[75] Inventors: Paul W. Casper, West Melbourne; Marc E. Sawyer, Melbourne, both of Fla.

[73] Assignee: Broadband Communications Products, Inc., Melbourne, Fla.

[21] Appl. No.: 08/882,923

[22] Filed: Jun. 26, 1997

Related U.S. Application Data

[63] Continuation-in-part of application No. 08/462,168, Jun. 5, 1995, Pat. No. 5,838,749.

[51] Int. Cl.⁶ ........................................................ H03D 3/24
[52] U.S. Cl. ............................................. 375/373; 375/327
[58] Field of Search ................................... 375/294, 354, 375/376, 359, 371, 372, 373, 327, 328, 326, 225, 226; 370/503, 516, 518; 327/105, 145, 156; 331/18, 14; 380/9; 329/307, 308

[56] References Cited

U.S. PATENT DOCUMENTS

| | | | |
|---|---|---|---|
| 4,538,119 | 8/1985 | Ashida | 331/1 |
| 4,926,447 | 5/1990 | Corsetto et al. | 375/120 |
| 5,367,545 | 11/1994 | Yamashita et al. | 375/118 |
| 5,448,598 | 9/1995 | Yousefi et al. | 375/376 |

*Primary Examiner*—Jason Chan
*Assistant Examiner*—Jean B Corrielus
*Attorney, Agent, or Firm*—Charles E. Wands

[57] ABSTRACT

To derive a clock embedded in a digital data stream, a variable data rate synchronizer includes a data rate estimator that derives an estimate of the data rate of data contained in the digital data signal, and a frequency estimator that derives an estimate of the frequency of the output of a voltage controlled oscillator. A phase lock loop includes a phase detector to which the digital data signal and the output of the voltage controlled oscillator are coupled and has an output coupled to a sweepable loop filter. The output of the loop filter is coupled to the voltage controlled oscillator. During an initital frequency acquisition mode, the sweep controller sequentially varies an analog voltage applied to the voltage controlled oscillator, until the estimate of the data rate effectively corresponds to the estimate of the frequency of the output of the voltage controlled oscillator. This terminates the frequency acquisition mode and initiates a phase acquisition mode, during which the sweep controller causes a sawtooth sweep of the loop filter, until the output of the loop filter corresponds to the actual frequency of said embedded clock signal, thereby locking the loop to the embedded clock.

8 Claims, 2 Drawing Sheets

CLOCK EXTRACTOR FOR HIGH SPEED, VARIABLE DATA RATE COMMUNICATION SYSTEM

CROSS-REFERENCE TO RELATED APPLICATIONS

The present application is a continuation-in-part of co-pending U.S. patent application Ser. No. 08/462,168 (hereinafter referred to as the '168 application), filed Jun. 5, 1995, and issue as U.S. Pat. No. 5,838,749, on Nov. 17, 1998, entitled: "High Speed Variable Data Rate Fiber Optic Communication System," by P. Casper et al, assigned to the assignee of the present application and the disclosure of which is herein incorporated.

FIELD OF THE INVENTION

The present invention relates in general to communication systems, such as, but not limited to high speed fiber optic communication systems, and is particularly directed to a new and improved data rate estimator-based, variable data rate synchronizer, that extracts a clock signal embedded within a digital data signal, so that a receiver may automatically tune itself to the data rate of a digital data stream, irrespective of frequency, within the range of data rate variation.

BACKGROUND OF THE INVENTION

As described in the above-referenced '168 application, because of their ability to transport signals over a very wide bandwidth, fiber optic communication systems are currently being installed to replace conventional metallic cable networks. In a typical fiber optic system, for a one-way transmission path, serial digital data and its associated clock are coupled to an electro-optic transmitter, which generates an optical signal that replicates the serial digital data stream, with the clock embedded in the data. At the opposite (far) end of the fiber optic link, an opto-electronic receiver processes the received serial digital signal stream, to extract the clock and recover the data.

One of the advantages of the wide band characteristics of optical fiber networks is their ability to transport a variety of broadband signals and their flexibility in the choice of data rates for transporting serialized digital data. However, at relatively high data rates (e.g. those above ten and on the order of several hundred MHz or higher, for example), the limited performance capabilities of readily available and less costly electronic circuits and components (which currently do not operate with picosecond response times required for high data rate signals) has required the use of sophisticated signal processing to embed the clock with the data and recover the clock signal from the serial digital data stream.

One proposal to alleviate this requirement and allow use of reasonably priced signal processing equipment involves encoding the data with a reduced complexity encoding scheme (such as biphase-S encoding). However, such an encoding scheme also mandates that the transmitter and receiver equipment be data rate-specific. For biphase encoding, in which continuous 1 and 0 patterns are encoded in accordance with biphase-S encoding rules, without a priori knowledge of the data pattern, the bit rate cannot be accurately determined. As a result, it is necessary to use bit rate specific transmitter and receiver components.

The invention described in the '168 application, now '749 patent describes a data rate estimation-based clock recovery scheme, that enables serial digital data communications to be conducted over a high bandwidth link (optical fiber) at a wide range of data rates (e.g. 10–300 Mb/s), so that the receiver may automatically recover the clock signal embedded in the digital data stream, but without a priori knowledge of the data pattern. In accordance with the clock recovery scheme of the '168 application, now U.S. Pat. No. 5,838,749, advantage is taken of a pre-scramble encoding scheme described in the U.S. Pat. No. 5,410,600 to J. Toy, entitled: "Pre-scramble encoding method and apparatus for digital communication," issued Apr. 25, 1995, assigned to the assignee of the present application and the disclosure of which is incorporated herein, to derive a relatively close or 'macro' estimate of the frequency of the embedded clock signal, that is within a few percent of the embedded clock frequency.

In particular, diagrammatically illustrated in FIG. 1, a variable bit rate estimator 11 is coupled to a serial data bus 13 carrying a digital data stream having a 'to be determined' data rate, which falls somewhere in an extended data rate range, as output by an opto-electronic receiver (not shown). The variable bit rate estimator 11 counts positive-going transitions in a divided-down version of the serial bit stream, to produce a multibit code representative of a 'relatively close' estimate (within a few percent) of the embedded data rate. The multibit code may be appropriately scaled to accurately estimate the rate of many different categories of NRZ serial data, including (but not limited to) pseudorandom sequences, SONET and SDH formatted data streams and 8B10B block-encoded data.

The data rate estimate code output by variable bit rate estimator 11 is coupled to a direct digital synthesizer and range selector controller 17, which operates on a first parsed segment (comprising a plurality of most significant bits) of the bit rate estimate code to set the output of a very precise numerically controlled oscillator within a direct digital synthesizer (DDS) 19. A divide-by-N divisor is used to define the divisor value of an octave divider within an 'inner' phase locked loop (PLL) 21, through which a scaled-up frequency derived from the precision reference clock signal generated by DDS 19 is scaled into a selected range of frequencies for deriving a variable bit sync clock signal, that is applied to a digital phase detector 25. A second parsed segment (a group of least significant bits) of the bit rate estimate code is used by the controller 17 to generate a multi-bit DDS control word (and associated write control signals) representative of the frequency to be generated by a very precise numerically controlled oscillator within the DDS 19.

The controller 17 is also coupled to receive a clock signal output by a precision crystal clock generator 27 and to a sync loss signal line 31 from downstream decoder circuitry. In response to acquiring and locking the embedded data clock (RCLOCK), the logic level on a sync loss line 31 from the downstream decoder circuitry changes state, disabling the clock acquisition mechanism, and causing the bit rate synchronizer to switch to tracking mode. The loss of sync signal is also coupled to a loop filter sweep generator 33 which, until clock acquisition, continuously generates a sawtooth signal for sweeping the output voltage of an analog loop filter 34 over a range that encompasses the frequency uncertainty of the bit rate estimate produced by the bit rate estimator 11.

An internal timing and control logic circuit is operative to scale the clock down for use by an analog-to-digital converter 35. The controller 17 also periodically supplies a gate pulse signal on line 18 to the variable bit rate estimator 11. In response to the variable bit sync clock signal generated by PLL 21, the digital phase detector 25 of a second, 'outer' phase locked loop clock recovery feedback path is operative to generate a VBSCLOCK output signal and a VBSDATA data stream. The digital phase detector 25 also couples filter control signals to analog loop filter 34 of the 'outer' phase locked loop clock recovery feedback path.

In operation, until lock is achieved, the logic level of a loss of sync signal on line 31 causes the loop filter sweep generator 33 of the outer phase locked loop to continuously generate a sawtooth waveform signal, for sweeping the output voltage of analog loop filter 34 over a range of operation that encompasses the frequency uncertainty of the bit rate estimate produced by bit rate estimator 11. The analog output of the loop filter 34 is converted by analog-to-digital converter 35 into a digital code, and is summed with a code from a look-up table to produce an output code that is used to control the frequency produced by a precision numerically controlled frequency generator of DDS 19.

The output of the DDS 19 is an extremely stable and precise clock current within the operational range of its numerically controlled oscillator. The octave of precision tuning range is sufficiently wide as to enable the frequency of the outer phase lock loop to sweep through the range of data rate variation corresponding to the embedded clock signal resolution, until the variable data rate sync clock signal generated by the inner phase lock loop 19 coincides with the embedded clock signal in the digital data. This signal is coupled to downstream circuitry to recover the data.

SUMMARY OF THE INVENTION

Now although the variable data rate clock recovery mechanism described in the '168 application, now U.S. Pat. No. 5,838,749, is a very effective scheme for recovering a variable rate clock embedded in a digital data stream, we have found that its cost can be reduced and its performance significantly improved by an alternative, simplified implementation that does not use a direct digital synthesizer and a continuously adjustable phase lock loop, for both frequency and phase acquisition, as detailed in the '168 application. Moreover, not only does the present invention provide a reduced cost and improved performance clock extractor, but data variation range is substantially improved (on the order of a factor of seven) and clock jitter is reduced.

In accordance with the present invention, the direct digital synthesizer of the clock recovery mechanism described in the '168 application, now U.S. Pat. No. 5,838,749, is replaced with a standard voltage controlled oscillator, which is controllably stepped during a frequency acquisition mode, until its output effectively corresponds to or is approximately equal to the data rate detected by a data rate estimator, and thereafter fine tuned by a swept loop filter during phase acquisition mode.

The architecture of the variable bit rate synchronizer of the present invention includes a variable bit rate estimator, to which an incoming serial data stream that has been divided down by one or more cascaded dividers is applied. A multibit code representative of a 'relatively close' estimate (e.g., within 2–4%) of frequency uncertainty of the embedded clock, as generated by the variable bit rate estimator, is applied to a frequency and phase sweep controller. During frequency acquisition mode, the sweep controller generates a sequentially incremented digital code, which is converted into an analog voltage by a digital-to-analog converter and coupled to a summing circuit, the output of which is coupled to an octave tuning voltage controlled oscillator. A second input of the summing circuit is coupled to the output of a controllably swept loop filter. During frequency acquisition mode, the output of the loop filter is clamped at zero, so that the output of summing circuit tracks the analog voltage output of the DAC.

The output of the VCO is scaled by a frequency divider, to produce a reduced frequency bit rate clock signal to facilitate processing by downstream logic circuitry. The divided down clock signal is coupled to a self-centering phase detector and to a VCO rate estimator circuit, which supplies to the sweep controller a multibit output code that is representative of the frequency of the output of the VCO. The phase detector is also coupled to receive the input data.

Comparator logic within the sweep controller compares the data rate estimate representative code supplied by the bit rate estimator with the VCO rate representative code provided by VCO rate estimator. During frequency acquisition mode, as long as the value of the bit rate estimator code is less than that of the VCO rate estimator code, a multibit counter within the sweep controller is incremented, so as to sequentially increase the value of the analog control voltage generated by the DAC and thereby causing the clock frequency to be incrementally swept. When the VCO estimator code equals the VCO rate estimator code, the multibit counter within the sweep controller is disabled, thereby terminating the frequency acquisition mode, and 'freezing' the value of the control code supplied by the sweep controller to the DAC, and thus the analog control voltage it supplies to the VCO.

Next, the phase acquisition mode is initiated by the sweep controller changing the logic state of a sweep enable link to the sweep control input of a loop filter from a 'fixed or non-sweep' value to a sweep enable value that causes a loop filter sweep generator within the loop filter to continuously generate a sawtooth waveform for sweeping the filter output voltage over a peak-to-peak range that encompasses the frequency uncertainty of the bit rate estimate code produced by the bit rate estimator. This range is symmetrically bipolar around the (zero) clamp voltage used during frequency acquisition mode.

The phase sweep logic level on the loop filter's sweep control input causes the loop filter sweep generator to sweep the filter's output voltage, which is summed with the fixed voltage value supplied from the DAC, thus sweeping the VCO output frequency about the 'frozen' value established in the frequency acquisition mode. As the VCO is swept, the divided down clock signal is compared in the phase detector with the input data, and the difference is applied to the loop filter. When the output of the loop filter sweeps past the actual frequency of the embedded clock signal (the output of the phase detector reaches zero), the phase acquisition loop will lock, causing a lock signal to be supplied to the sweep controller. In response to this phase lock signal, the sweep controller terminates the sweep of the loop filter. The phase locked loop thereafter continues to track the embedded clock frequency, until an anomaly occurs which causes a loss of lock, whereupon the frequency—phase acquisition process described above is reinitiated.

DETAILED DESCRIPTION

Figure 1:
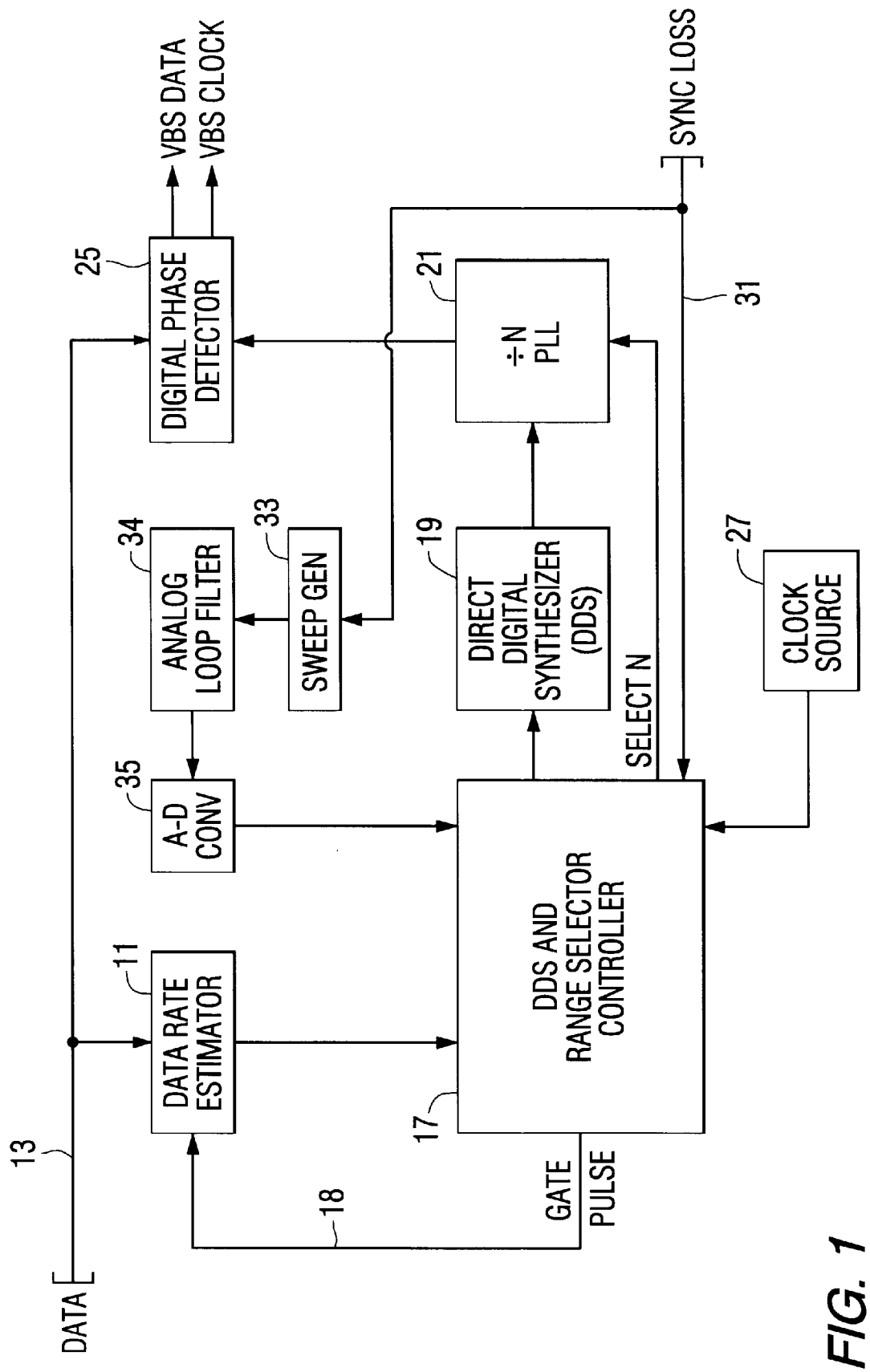
FIG. 1 diagrammatically illustrates the architecture of a variable bit synchronizer of the receiver detailed in the above-referenced '168 application, now U.S. Pat. No. 5,838,749.

Before describing in detail the adaptive bit rate synchronization mechanism of the present invention, it should be observed that the invention resides primarily in what is effectively a prescribed set of conventional digital communication signalling components and attendant supervisory firmware and control logic therefor, that supervise the operations and states of such components. Consequently, the configuration of such signal processing components and the manner in which they are interfaced with one another and interface equipment of a digital communication system have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations of the Figures are primarily intended to illustrate the major components of the system in a convenient functional grouping, whereby the present invention may be more readily understood.

Figure 2:
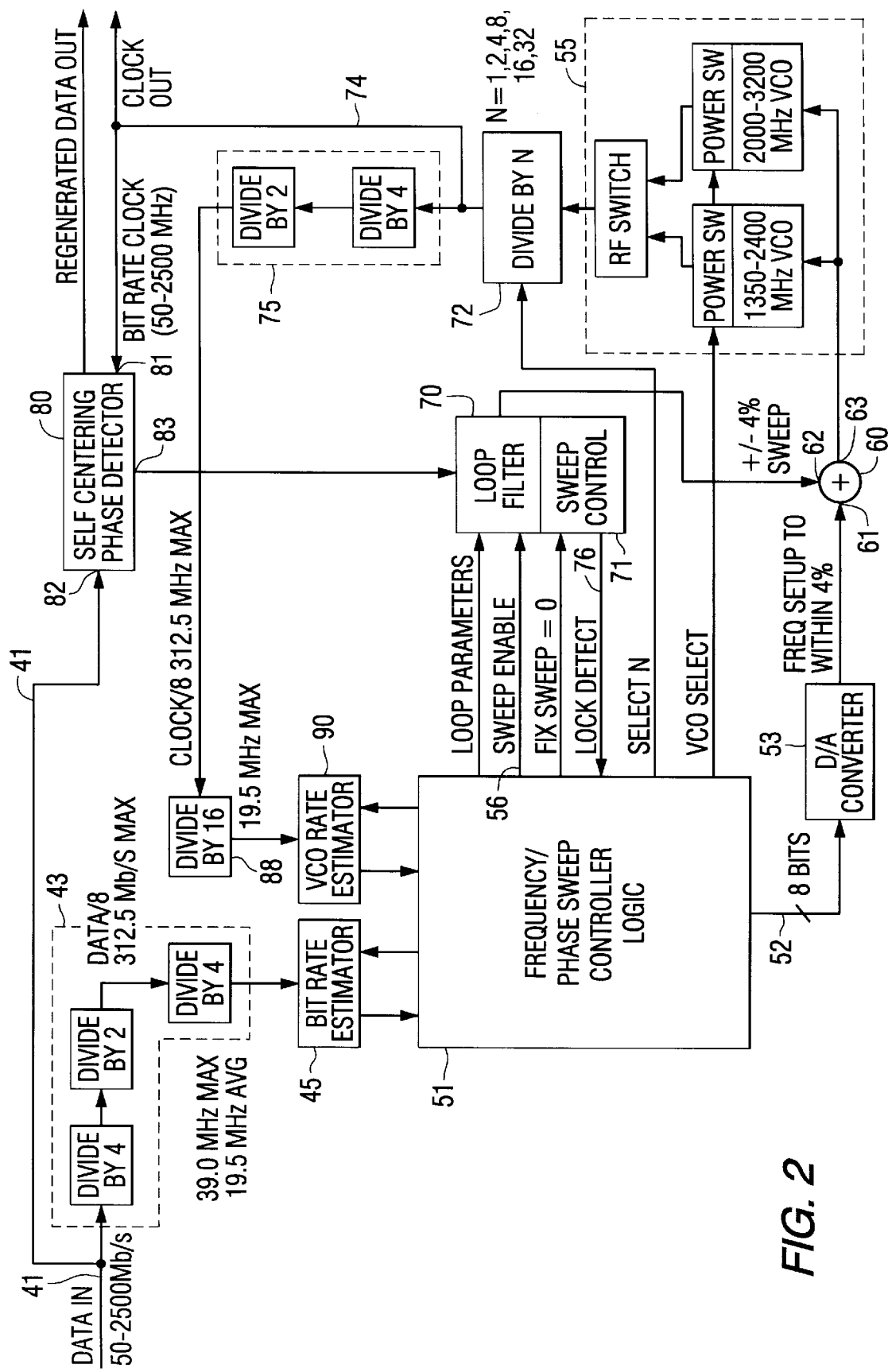
FIG. 2 diagrammatically illustrates the configuration of the variable bit rate synchronizer of present invention.

The architecture of the variable bit rate synchronizer of the present invention is diagrammatically shown in FIG. 2 as comprising an input link 41, to which a serial digital data stream as output by an opto-electronic receiver, having a 'to-be-determined' data rate lying in a range of 50–2500 Mb/s, as a non-limiting example, is applied. (This data rate range is on the order of seven times wider than that of the clock extractor of the '168 application, now U.S. Pat. No. 5,838,749.)

The incoming serial data stream is divided down by one or more cascaded dividers, shown in broken lines 43, to provide a divided down data stream that is applied to a variable bit rate estimator 45. As a non-limiting example, variable bit rate estimator 45 may be implemented as described in the '168 application, now U.S. Pat. No. 5,838,749, being operative to count positive-going transitions in the divided-down version of the serial bit stream, to produce a multibit binary code representative of a relatively precise measure (e.g., within 2%) of the embedded data rate.

The multi-bit data rate estimate code output by bit rate estimator 45 is coupled to a frequency/phase sweep controller 51. Sweep controller 51, which may be implemented as a field programmable gate array logic circuit, is initially operative to generate a sequentially incremented digital code on output link 52, which is converted into an analog voltage by digital-to-analog converter (DAC) 53, and used during frequency acquisition mode to sweep an octave tuning voltage controlled oscillator (VCO) 55. To encompass the bandwidth of the present example VCO 55 may be implemented using a pair of switched, overlapping range VCOs, as shown in the broken lines.

DAC 53 has its output coupled to a first input 61 of a summing circuit 60, the output 63 of which is coupled to VCO 55. A second input 62 of summing circuit 60 is coupled to the output of a controllably swept loop filter 70. (As will be described, during the frequency acquisition mode, the output of the loop filter 70 is clamped at zero, so that the output of summing circuit 60 exactly replicates the analog voltage output of DAC 53.)

The output of the VCO 55 is coupled to a divide-by-N divider 72, which is operative to divide the frequency of the output of VCO 55 by a selected scaling binary value supplied by sweep controller 51, and to produce a bit rate clock signal as an output clock on line 74. This bit rate clock signal is divided down by one or more cascaded binary dividers, shown within broken lines 75, to produce a reduced frequency clock signal having a reduced (subdivided) frequency that is readily processed by downstream logic circuitry. The divided down clock signal from divide-by-N divider 72 is coupled to a first input 81 of a self-centering phase detector 80 and, via dividers 75 and 88, to a VCO rate estimator circuit 90, which supplies a multibit output code to sweep controller 51 representative of the frequency of the output of VCO 55. A second input 82 of phase detector 80 is coupled to data input link 41 transporting the input serial data stream. Comparator logic within the sweep controller 51 is operative to compare the data rate estimate representative code supplied by bit rate estimator 45 with the VCO rate representative code provided by the VCO rate estimator circuit 90.

As will be described, during frequency acquisition mode, as long as the value of the bit rate estimator code is less than that of the VCO rate estimator code, a multibit counter within the sweep controller 51 continues to be incremented, thereby sequentially increasing the value of the analog control voltage generated by DAC 53, and causing the clock frequency to be incrementally swept. Once the value of the VCO estimator code becomes equal to the VCO rate estimator code, the multibit counter within sweep controller 51 is disabled, terminating the frequency acquisition mode, and 'freezing' the value of the control code supplied by the sweep controller 51 to the DAC 53, and thus the analog control voltage applied by the DAC to VCO 55.

Once the frequency acquisition mode is completed, phase acquisition mode is initiated by sweep controller 51 changing the logic state of a sweep enable link 56 to the sweep control 71 of loop filter 70 from a 'fixed or non-sweep' value (e.g., '0') to a sweep enable value (e.g, '1'). This sweep enable state causes a loop filter sweep generator within the loop filter 70 to continuously generate a sawtooth waveform for sweeping the filter output voltage over a peak-to-peak range encompassing the frequency uncertainty of the bit rate estimate code produced by bit rate estimator 45. This range is symmetrically bipolar around zero volts clamp voltage used during frequency acquisition mode. Because the clock extractor of the invention employs only a single phase locked loop which employs a standard VCO in place of the dual PLL configuration containing the precision numerically controlled digital synthesizer of the '168 application, now U.S. Pat. No. 5,838,749, not only is complexity reduced but clock jitter is substantially improved.

OPERATION

As described above, as a non-limiting example, the data rate of the digital data at the transmit end of a communication (optical) fiber link may vary within a clock range of 50–2500 Mb/s. This serial digital data stream is used to modulate an optical signal that is transmitted from the upstream site over an optical fiber to a downstream receiver site. At the downstream receiver, the serial bit stream derived by an optical receiver is coupled to the second input 82 of phase detector 80 and input link 41 of the variable bit rate estimator 45 of the variable bit synchronizer of FIG. 2.

Frequency Acquisition Mode

As described above, the variable bit rate estimator 45 counts positive-going transitions in a divided-down version of the serial bit stream, produced by divider 43, to produce a multibit code representative of a 'relatively close' estimate that is within a relatively close window (e.g., within 2–4%) of frequency uncertainty of the embedded clock signal.

The respective bits of the bit rate estimate code are decoded by the sweep controller 51 into a (three bit) code that selects one of the divisor values N=1, 2, 4, 8, 16 and 32 employed by the frequency range scaler/divider 72, thereby specifying which octave of the frequency range (e.g., 50–2500 MHz) contains the embedded clock signal. As the frequency sweep control counter within the sweep controller 51 is sequentially incremented, its corresponding multibit digital output code on line 52 is converted into an analog control voltage by the DAC 53, that stepwise increases the output frequency of the VCO 55.

As the output frequency produced by VCO 55 is divided down by a divide-by-N divider 72 in accordance with the scaling binary value supplied over link 52 by the sweep controller 51, the resulting clock signal is coupled to VCO rate estimator circuit 90, which supplies a multibit output code to the sweep controller 51 representative of the frequency of the output of VCO 55. Within the sweep controller 51, comparator logic compares the data rate (bit rate) estimate representative code supplied by bit rate estimator 45 with the VCO rate representative code provided by VCO rate estimator circuit 90.

As noted earlier, during frequency acquisition mode, as long as the value of the bit rate estimator code produced by data rate estimator 45 is less than that of the VCO rate estimator code produced by VCO rate estimator circuit 90, the multibit counter within the sweep controller 51 continues to be incremented, causing the clock frequency produced by VCO 55 to be incrementally swept. Eventually, when the value of the VCO estimator code becomes equal to the bit rate estimator code, the multibit counter within the sweep controller 51 is disabled, terminating the frequency acquisition mode, and 'freezing' the VCO control code to the first input 61 to summing circuit 60. It also changes the logic state of a sweep enable link 56 to the sweep control 71 of loop filter 70 from its previous non-sweep value to a loop filter phase-sweep enable value, that initiates the phase acquisition mode.

Phase Acquisition Mode

The phase sweep logic level on the loop filter's sweep control 71 causes the loop filter sweep generator within the loop filter 70 to begin continuously generating a sawtooth waveform for sweeping the filter's output voltage over a peak-to-peak range that encompasses the frequency uncertainty of the bit rate estimate code produced by bit rate estimator 45. This swept loop filter output voltage is coupled to the second input 62 of summing circuit 60, so as to be summed with the fixed voltage value supplied to its first input 61 from DAC 53, thus sweeping the VCO output frequency relative to the 'frozen' value established in the frequency acquisition mode.

As the output of the VCO 55 is swept, the resulting divided down clock signal produced by divide-by-N divider 72 is compared in self-centering phase detector 80 with the input data supplied to input link 41, and the difference is applied to loop filter 70 of the phase acquisition loop. When the swept output of the loop filter 70 sweeps past the correct frequency of the embedded clock signal (the output 83 of the phase detector reaches zero), the phase acquisition loop will lock, causing a lock detect signal to be supplied over line 76 to the sweep controller 51. In response to this phase lock signal, the sweep controller changes the state of the sweep enable line 56, terminating the sweep of the loop filter. The phase locked loop thereafter continues to track the embedded clock frequency, until an anomaly occurs which causes a loss of lock, whereupon the frequency—phase acquisition process described above is reinitiated. The retimed data output by the phase detector 80 is then coupled to downstream circuitry for data processing.

As will be appreciated from the foregoing description, the variable data rate clock recovery mechanism of the invention reduces the cost and improves the performance of the clock synchronizer described in the above-referenced '168 application, now U.S. Pat. No. 5,838,749, by replacing the direct digital synthesizer with a standard voltage controlled oscillator, that is controllably stepped during a frequency acquisition mode until its output effectively corresponds to the data rate detected by a data rate estimator to which the incoming data is applied. Thereafter, during phase acquisition mode, the VCO is fine tuned by a swept loop filter. Like the data rate synchronizer in the '168 application, now U.S. Pat. No. 5,838,749, the variable data rate bit synchronizer of the invention is able to automatically recover the clock signal embedded in the received digital data stream, without a priori knowledge of the data pattern or requiring transmit and receive components to be data rate specific. The variable data rate bit synchronizer of the invention is capable of accepting any data rate within the operational data clock signal range of the system, and automatically tunes itself to the data clock signal embedded in the received serial digital data stream.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. An apparatus for extracting, from a digital data signal, an embedded clock signal that falls within a data clock signal range comprising:

a data rate estimator that is coupled to receive said digital data signal and is operative to derive therefrom a data rate estimate signal representative of an estimate of the data rate of data contained in said digital data signal;

a phase-locked loop that includes a reference clock signal generator, a phase detector having a first input coupled to receive said digital data signal, a second input coupled to receive a signal representative of said reference clock signal, and an output, and a controllably sweepable loop filter coupled in a loop path including said reference clock signal generator and said phase detector; and a controller which is operative to controllably inhibit a sweep of said loop filter, while varying said reference clock signal generated by said reference clock signal generator, until said reference clock signal reaches a value established in accordance with said data rate estimate signal, and to thereafter controllably sweep said loop filter, and thereby said phase-locked loop, until said phase detector produces an output representative that said phase-locked loop is locked to said embedded clock signal of said digital data signal.

2. An apparatus according to claim 1, wherein said controller is operative to generate a varying control signal which varies said reference clock signal at a first coarse resolution of frequency variation, until said reference clock signal reaches a value having a prescribed relationship with respect to said data rate estimate signal, and thereafter controllably sweeps said loop filter at a second fine resolution of frequency variation, until said phase detector produces an output representative that said phase-locked loop is locked to said embedded clock signal of said digital data signal.

3. An apparatus according to claim 2, wherein said controller is operative to generate a first varying control code, which varies said reference clock signal until said reference clock signal reaches a value corresponding to said data rate estimate, and thereafter terminates varying of said first control code, and controllably sweeps said loop filter at said second fine resolution of frequency variation, until said phase detector produces an output representative that said phase-locked loop is locked to said embedded clock signal of said digital data signal.

4. An apparatus for extracting, from a digital data signal, an embedded clock signal that falls within a data clock signal range comprising:

a data rate estimator coupled to receive said digital data signal and operative to derive therefrom an estimate of the data rate of data contained in said digital data signal;

a voltage controlled oscillator;

a frequency estimator operative to derive an estimate of the frequency of the output of said voltage controlled oscillator;

a frequency/phase sweep controller, which is operative, during a frequency acquisition mode, to apply a sequentially varied analog voltage to said voltage controlled oscillator, until said estimate of the data rate of data contained in said digital data signal effectively corresponds to said estimate of the frequency of the output of said voltage controlled oscillator; and a phase lock loop, including a phase detector to which said digital data signal and said output of said voltage controlled oscillator are coupled and having an output coupled to a sweepable loop filter, said sweepable loop filter having an output coupled to said voltage controlled oscillator; and wherein said frequency/phase sweep controller is operative, during a phase acquisition mode, to sweep said loop filter until the output of said loop filter corresponds to the actual frequency of said embedded clock signal.

5. An apparatus according to claim 4, wherein said frequency/phase sweep controller is operative, in response to said estimate of the data rate of data contained in said digital data signal effectively corresponding to said estimate of the frequency of the output of said voltage controlled oscillator, to terminate said frequency acquisition mode, fixing said analog voltage applied to said voltage controlled oscillator, and changing the state of operation of said loop filter from a non-sweep state value to a loop filter phase-sweep enable value, that initiates the phase acquisition mode.

6. A method for extracting, from a digital data signal, an embedded clock signal that falls within a data clock signal range comprising the steps of:

(a) monitoring said digital data signal and deriving therefrom an estimate of the data rate of data contained in said digital data signal;

(b) generating a reference clock whose frequency is varied until said reference clock approximates said data rate estimate derived in step (a);

(c) in response to said reference clock approximating said data rate estimate in step (b), sweeping a loop filter coupled in a loop path including said reference clock and a phase detector of a phase-locked loop, until said phase detector produces an output representative that said phase-locked loop is locked to said embedded clock of said digital data signal.

7. A method according to claim 6, wherein step (b) comprises generating a control signal which varies said reference clock at a first coarse resolution of frequency variation, until said reference clock reaches a value that approximates said data rate estimate, and thereafter controllably sweeping said loop filter at a second fine resolution of frequency variation, until said phase detector produces an output representative that said phase-locked loop is locked to said embedded clock of said digital data signal.

8. A method according to claim 6, wherein step (b) comprises generating a first varying control code, which varies said reference clock until said reference clock reaches a value corresponding to said data rate estimate, and thereafter terminating variation of said first control code, and initiating a controlled sweep of said loop filter at said second fine resolution of frequency variation, until said phase detector produces an output representative that said phase-locked loop is locked to said embedded clock of said digital data signal.

* * * * *